(12) United States Patent
Kawaguchi et al.

(10) Patent No.: US 6,878,992 B2
(45) Date of Patent: Apr. 12, 2005

(54) VERTICAL-TYPE POWER MOSFET WITH A GATE FORMED IN A TRENCH

(75) Inventors: Yusuke Kawaguchi, Miura-gun (JP);
Norio Yasuhara, Kawasaki (JP);
Kazutoshi Nakamura, Yokohama (JP);
Akio Nakagawa, Fujisawa (JP);
Syotaro Ono, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 28 days.

(21) Appl. No.: 10/091,423

(22) Filed: Mar. 7, 2002

(65) Prior Publication Data

US 2002/0125528 A1 Sep. 12, 2002

(30) Foreign Application Priority Data

Mar. 9, 2001 (JP) ........................................ 2001-066707

(51) Int. Cl.$^7$ .......................... H01L 29/76; H01L 29/94; H01L 21/336; H01L 31/062
(52) U.S. Cl. ........................ 257/330; 257/329; 257/331; 257/339; 257/488; 257/332; 257/333; 257/334; 438/259; 438/270; 438/589
(58) Field of Search ................................ 257/329, 330, 257/331, 332, 333, 334, 488; 438/259, 270, 589

(56) References Cited

U.S. PATENT DOCUMENTS

| | | | | |
|---|---|---|---|---|
| 4,941,026 A | * | 7/1990 | Temple | 257/333 |
| 5,326,711 A | * | 7/1994 | Malhi | 437/33 |
| 5,637,898 A | | 6/1997 | Baliga | |
| 5,661,322 A | * | 8/1997 | Williams et al. | 257/331 |
| 5,679,966 A | | 10/1997 | Baliga et al. | |
| 5,760,440 A | * | 6/1998 | Kitamura et al. | 257/328 |
| 5,828,101 A | * | 10/1998 | Endo | 257/330 |
| 5,831,288 A | * | 11/1998 | Singh et al. | 257/77 |
| 5,844,273 A | | 12/1998 | Konishi | |
| 5,895,952 A | * | 4/1999 | Darwish et al. | 257/330 |
| 5,998,833 A | * | 12/1999 | Baliga | 257/329 |
| 6,008,520 A | * | 12/1999 | Darwish et al. | 257/330 |
| 6,252,258 B1 | * | 6/2001 | Chang et al. | 257/133 |
| 6,252,288 B1 | * | 6/2001 | Chang | 257/471 |
| 6,285,060 B1 | * | 9/2001 | Korec et al. | 257/342 |
| 6,359,308 B1 | * | 3/2002 | Hijzen et al. | 257/341 |
| 6,380,569 B1 | * | 4/2002 | Chang et al. | 257/256 |
| 6,509,608 B1 | * | 1/2003 | Hueting | 257/330 |
| 6,525,375 B1 | * | 2/2003 | Yamaguchi et al. | 257/341 |

FOREIGN PATENT DOCUMENTS

EP    0 238 749 A2    9/1987

OTHER PUBLICATIONS

Baliga, B.J., "Critical Nature of Oxide/Interface Quality for SIC Power Devices", 9$^{th}$ Biennial Conference on Insulating Films on Semiconductors, Villard De Lans, France, 7–10 Jun. 1995, Microelectronic Engineering, Jun. 1995, Elsevier Publishers B.V., Amsterdam, Netherlands, vol. 28, No. 1–4, pp. 177–184.

* cited by examiner

*Primary Examiner*—Nathan J. Flynn
*Assistant Examiner*—Fazli Erdem
(74) *Attorney, Agent, or Firm*—Oblon, Spivak, McClelland, Maier & Neustadt, P.C.

(57) ABSTRACT

A power MOSFET comprises, between source and drain electrodes, a low resistive semiconductor substrate of a first conductivity type, a drift layer of the first conductivity type formed on the semiconductor substrate, a high resistive epitaxial layer of the first conductivity type formed on the drift layer, trenches formed to extend from a surface of the epitaxial layer into the drift layer, gate electrodes buried in the trenches with gate insulating films interposed between the gate electrodes and walls of the trenches, low resistive source layers of the first conductivity type formed in a surface region of the epitaxial layer adjacent to the gate insulating films, and a base layer of a second conductivity type formed in the surface region of the epitaxial layer, wherein the epitaxial layer intervening between the trenches is depleted in a case where 0 volt is applied between the source electrode and the gate electrodes.

31 Claims, 7 Drawing Sheets

VERTICAL-TYPE POWER MOSFET WITH A GATE FORMED IN A TRENCH

CROSS REFERENCE TO RELATED APPLICATIONS

This application is based upon and claims the benefit of priority from the prior Japanese Patent Application No. 2001-066707, filed on Mar. 9, 2001, the entire contents of which are incorporated herein by reference.

BACKGROUND OF THE INVENTION

1. Field of the Invention

The present invention relates to a power MOSFET, in particular, a vertical-type power MOSFET (referred to as "power MOSFET", hereinafter) having a gate formed in a trench, which is generally used with a breakdown voltage of 100V or less.

2. Description of the Related Art

Recently, the use of the power MOSFET has greatly increased not only in the market for large-current, high-breakdown voltage switching power supply but also in the market for energy saving switches for mobile communication apparatuses such as note type personal computers. The power MOSFET is applied to a power management circuit or a safety circuit of a lithium ion battery. Thus, the power MOSFET is exceedingly desired to attain low voltage operation, which makes it possible to directly drive the MOSFET with battery voltage, and low ON-state resistance.

Figure 9:
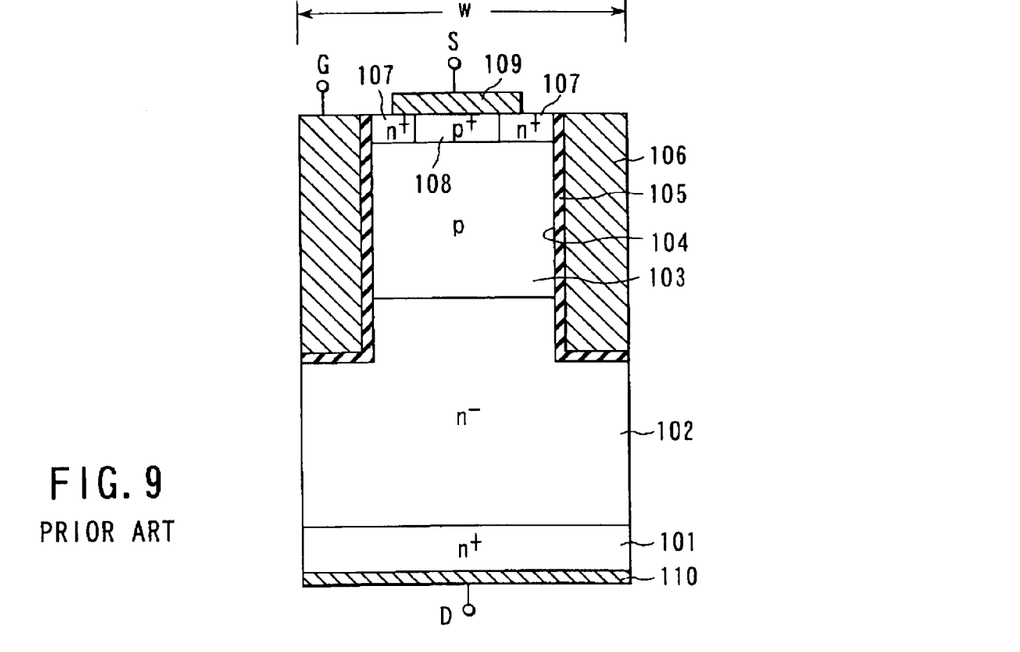
FIG. 9 is a diagrammatic cross-sectional view showing the structure of a unit cell part in a conventional power MOSFET.

Conventionally, the power MOSFET of this type has a structure as shown in FIG. 9. FIG. 9 is a cross-sectional view showing the structure of a unit cell part of the conventional n-channel MOSFET. In the trench gate MOSFET, an n– type drift layer 102 is formed on a first main surface of an n+ type silicon substrate 101 as an n+ type drain layer, to have the thickness of 2.0 $\mu$m, for example. A p type base layer 103 is formed on the n– type drift layer 102. In the p type base layer 103 and the n– type drift layer 102, a plurality of trenches 104 are formed at predetermined intervals to have the depth of passing through the p type base layer 103 and extending into the n– type drift layer 102 with a predetermined depth.

In the trench 104, gate electrodes 106 are buried with gate insulating films 105, for example, having the thickness of 25 nm intervening therebetween.

In the surface region of the p type base layer 103, a pair of n+ type source layers 107 are formed by a selective impurity diffusion method adjacent to the gate insulating films 105 formed in the trench 104. In addition, in the surface region of the p type base layer 103 between the pair of the n+ type source layers 107, a p+ type layer 108 is formed by the selective impurity diffusion method. A source electrode 109 is formed to come into contact with both the pair of n+ type source layers 107 and the p+ type layer 108. On the second main surface of the n+ type silicon substrate 101, opposite side to the n– type drift layer 102, a drain electrode 110 is provided.

In the MOSFET having a structure described above, ON resistance of the device is determined mainly by channel resistance in the p type base layer 103 and resistance of the drift layer 102. Therefore, in the past, when the width of the unit cell, denoted by w in FIG. 9, is reduced, channel density on the silicon substrate 101 has been increased. As a result, the ON resistance of the power MOSFET device has been reduced.

However, in recent years, miniaturization of the device has been improved with the progress of manufacturing process, so that the width w of the unit cell has been reduced. Accordingly, the channel density has been increased, and thus two third of the entire ON resistance in the MOSFET device is occupied with resistance of the aforementioned drift layer 102. Therefore, a problem arises, even if technique of miniaturizing is improved so as to reduce the width w of the unit cell, the ON resistance cannot be reduced remarkably. For example, in a 30V (breakdown voltage) type of power MOSFET, it is very difficult to reduce the ON resistance to 20 m$\Omega$.mm$^2$ or less.

Figure 10:
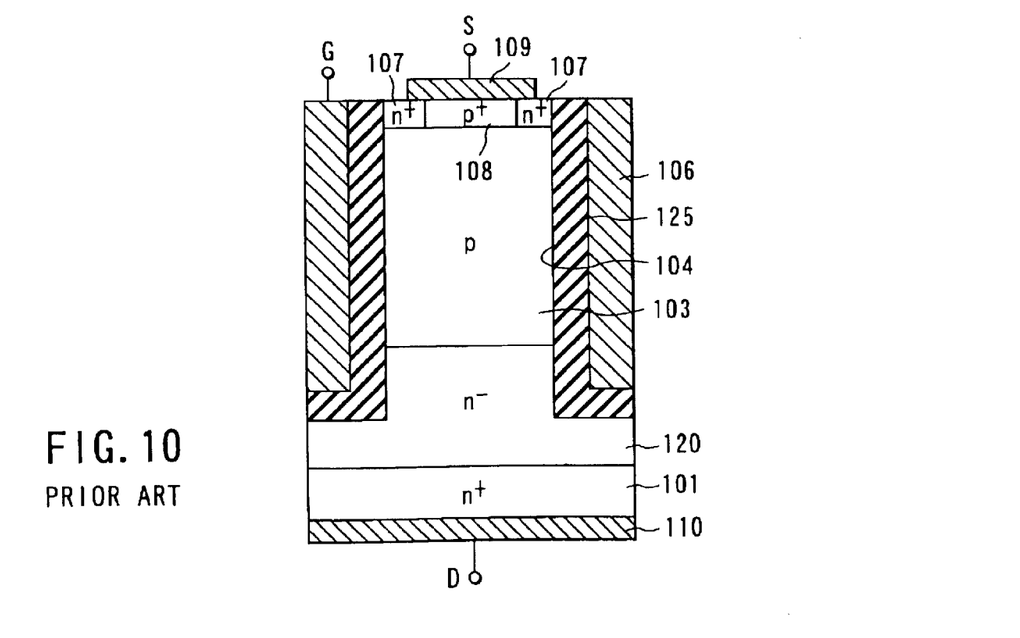
FIG. 10 is a diagrammatic cross-sectional view showing the structure of a unit cell part in another conventional power MOSFET.

To solve the above problem, as shown in FIG. 10, there has been proposed a power MOSFET having the structure in that the thickness of the drift layer 120 is reduced by forming gate insulating films 125 to be thick, so that resistance of the drift layer 120 is reduced.

More specifically, as shown in FIG. 10, the n– type drift layer 120 and the p type base layer 103 are formed on the n+ type silicon substrate 101, and a plurality of trenches 104 are formed in the p type base layer 103 and the n– type drift layer 102. The plurality of trenches 104 are formed from the p type base layer 103 into the n– type drift layer 120.

In the trenches 104, the gate electrodes 106 are buried in the trenches 104 with the gate insulating film 125, whose film is thick, intervening therebetween. In the surface region of the p type base layer 103, a pair of n+ type source layers 107 are selectively formed by selectively diffusing impurities adjacent to the thick gate insulating films 125 formed on an inner wall of the trenches 104. In addition, the p+ type layer 108 is formed between the pair of n+ type source layers 107 by selectively diffusing impurities. The source electrode 109 is formed to be in contact with both the n+ type source layers 107 and the p+ type layer 108. On the second main surface of the n+ type silicon substrate 101, opposite side to the n– type drift layer 102, the drain electrode 110 is provided.

The gate insulating film 125 is formed to be thick, i.e., to have the thickness of 100 nm as compared with the thickness of 25 nm in the case of the power MOSFET shown in FIG. 9. By making the gate insulating film 125 to share voltage to be applied between the gate electrode 106 and the drain electrode 110, the thickness of the n– type drift layer 120 is formed to be thin, i.e., 0.5 $\mu$m as compared with the thickness of 2.0 $\mu$m in the power MOSFET shown in FIG. 9, thereby reducing the resistance of the n– type drift layer 120.

However, in this power MOSFET device, the following problem arises. That is, in a case where the gate insulating films 125 are simply formed to be thick and the thickness of the drift layer 120 intervening between the gate insulating films 125 and the n+ substrate 101 is formed to be thin as shown in FIG. 10, the resistance of the drift layer 120 can be reduced, however, the threshold voltage of the channel increases by contraries. Thus, the channel resistance is increased in applying the same gate voltage as before. For this reason, it is difficult to reduce the entire ON resistance over the device.

As described above, in any one of the conventional power MOSFETs shown in FIG. 9 and FIG. 10, there has been a problem in that the ON resistance cannot be reduced while miniaturizing the device.

BRIEF SUMMARY OF THE INVENTION

A power MOSFET according to an aspect of the invention, comprises:

a low resistive semiconductor substrate of a first conductivity type having a first main surface and a second main surface opposing to each other;

a drift layer of the first conductivity type formed on the first main surface of the semiconductor substrate;

a high resistive epitaxial layer of the first conductivity type formed on the drift layer;

trenches formed in a manner of extending into the drift layer from a surface of the epitaxial layer;

gate electrodes, each buried in the trench with a side and bottom face of the trench interposed by a gate insulating film;

low resistive source layers of the first conductivity type formed on a surface of the epitaxial layer to be in contact with the trenches;

a base layer of a second conductivity type formed on the surface of the epitaxial layer;

a source electrode electrically connected to the source layer and the base layer; and a drain electrode electrically connected to the second main surface of the semiconductor substrate, wherein the epitaxial layer intervening between the trenches is depleted in a case where 0 volt is applied between the source electrode and the gate electrodes.

DETAILED DESCRIPTION OF THE INVENTION

Various embodiments of the present invention now will be described with reference to the accompanying drawings. In the following embodiments, an n type means a first conductive type and a p type means a second conductive type.

(First Embodiment)

Figure 1:
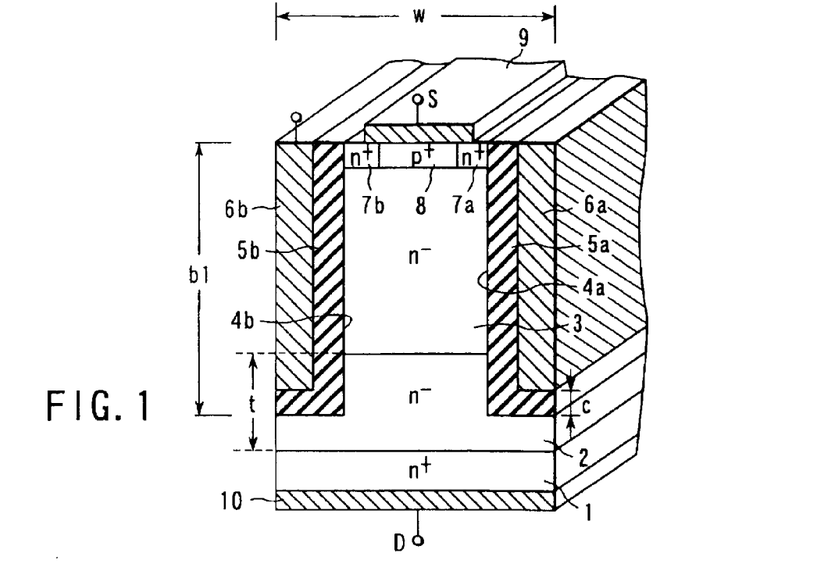
FIG. 1 is a diagrammatic perspective view showing the structure of a unit cell part in a power MOSFET device according to a first embodiment of the invention.

FIG. 1 is a diagrammatic and perspective view showing a structure of a unit cell part in an n-channel type of trench gate vertical-type power MOSFET according to the first embodiment of the invention.

As shown in FIG. 1, in this power MOSFET, an n– type drift layer 2 is formed to have the thickness t by epitaxial growth on the first main surface of an n+ type silicon substrate (semiconductor substrate) 1 as a n+ type drain layer. On the n– type drift layer 2, an n--type epitaxial layer 3 as an n--type base layer, is formed by epitaxial growth.

In the n--type base layer 3 and the n– type drift layer 2, a plurality of (only one pair is shown in FIG. 1) trenches 4a and 4b are formed through the n--type base layer 3 and having the depth b1 so that the lower portion of the trenches 4a, 4b reach into the intermediate part of the n– type drift layer 2. In the pair of trenches 4a and 4b, gate electrodes (control electrodes) 6a and 6b are buried, respectively, with gate insulating films 5a and 5b interposed therebetween.

In a surface region of the n--type base layer 3, n+ type source layers 7a and 7b are formed by a selective impurity diffusion method adjacent to the gate insulating films 5a and 5b formed in the trenches 4a and 4b, respectively. In addition, in the surface region of the n--type base layer 3 between the n+ type source layers 7a and 7b, a p+ type base layer 8 is formed by a selective impurity diffusion method.

A source electrode 9 as the first main electrode is provided to come into contact with both the pair of n+ type source layers 7a, 7b and the p+ type base layer 8. On the second main surface, opposite side to the n– type drift layer 2 of the n+ type silicon substrate 1, a drain electrode 10 as the second main electrode is provided.

In the present embodiment, the high resistance n--type base layer 3 is used for the conventional p type base layer, and the width w of the unit cell and an impurity concentration N are set such that the n--type base layer 3 is completely depleted when no voltage is applied between the source electrode 9 and the gate electrodes 6a, 6b. In this embodiment, the width w is set at 0.8 μm, and the impurity concentration N is set at $1 \times 10^{15}/cm^3$, for example.

Figure 2:
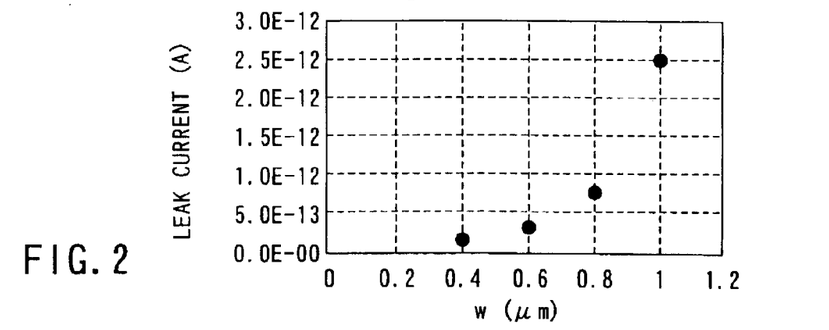
FIG. 2 is a graph showing the relation between a width w of the unit cell according to the first embodiment of the invention and a leak current in a turn-off state.
Figure 3:
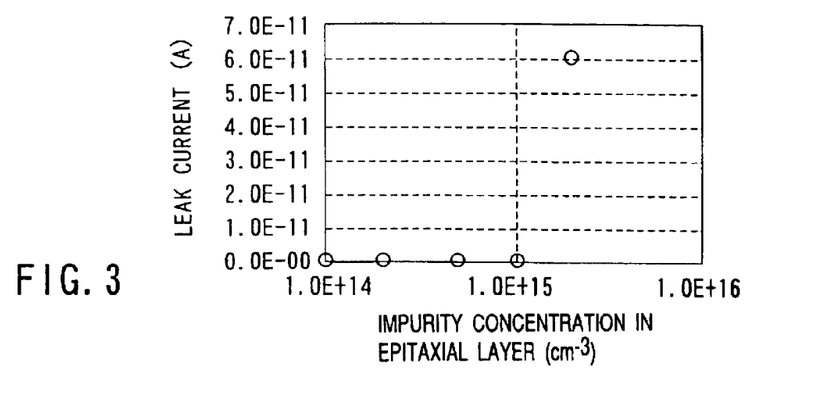
FIG. 3 is a graph showing the relation between an impurity concentration of an n--type epitaxial layer (base layer) and a leak current in a turn-off state according to the first embodiment of the invention.

FIG. 2 is a view showing a relationship between the width w of the unit cell and a leak current in w a turn-off state of the device having a structure as shown in FIG. 1. FIG. 3 is a view showing a relationship between an impurity concentration of the n--type epitaxial layer 3 (base layer) and a leak current in a turn-off state of the device having a structure as shown in FIG. 1. It is obvious from FIG. 2 and FIG. 3 that the leak current is sufficiently low when the width w of the unit cell is 0.8 μm or less, and the leak current is also sufficiently low when the impurity concentration N of the epitaxial layer 3 is $1.0 \times 10^{15}/cm^3$ or less. Consequently, it is desirable to form a power MOSFET device having these width w and impurity concentration N.

In addition, assuming that breakdown voltage of the apparatus is VB and a breakdown critical electric field of silicon is $3 \times 10^5$ V/cm, the thickness t of the n– type drift layer 2 of FIG. 1 is set to satisfy the following relational expression.

$$t < VB/3 \times 10^5 \text{ V/cm} \tag{1}$$

The reason for the above setting will be described below. The breakdown critical electric field of silicon is $3 \times 10^5$ V/cm. Now, it is assumed that voltage to be applied between the gate electrodes 6a, 6b (source electrode 9) and the drain electrode 10 is undertaken on only the drift layer 2, and a uniform electric field is applied over the drift layer 2.

At the time of breakdown, the following expression is effected between the breakdown voltage VB and the thickness t of the n– type drift layer 2.

$$t \leq VB/(3 \times 10^5 \text{V/cm}) \quad (2)$$

In the present embodiment, the gate insulating films 5a and 5b are made thick so as to share voltage when the voltage is applied between the gate electrodes 6a, 6b (source electrode 9) and the drain electrode 10. Therefore, the following expression is not valid, $$t = VB/(3 \times 10^5 \text{V/cm}) \quad (3)$$

and thus the thickness t of the drift layer 2 is set to satisfy the expression (1).

For example, the specific dimension of the device according to the embodiment of FIG. 1 is as follows. The width w is set at 0.8 $\mu$m; the depth b of the trench 4a, 4b, 2.0 $\mu$m; the thickness c of the gate insulating film 5a, 5b, 0.1 $\mu$m; and the thickness t of the drift layer 2, 0.5 $\mu$m.

Next, an operation of the power MOSFET shown in FIG. 1 will be explained. First of all, an ON-state of the power MOSFET will be described.

When a voltage is applied between the source electrode 9 and drain electrode 10 in a forward direction so as to supply a positive voltage to the gate electrodes 6a and 6b with respect to the source electrode 9, an accumulation layers (channel layers) are formed on both sides, facing to the gate electrodes 6a and 6b, of the n—-type base layer 3. Then, electrons as carriers are injected from the n+ type source layers 7a and 7b into the n– type drift layer 2, so that the device is turned on.

In an OFF-state, by setting the voltage of the gate electrodes 6a and 6b at 0V (or 0V is applied between the gate electrodes 6a and 6b and the source electrode 9), it becomes impossible to form the accumulation layers in the base layer 3. Then, the n—-type base layer 3 turns into a state of being filled with a depletion layer, so that the device is turned off.

According to the power MOSFET having the structure as above described, a channel area comprises not conventional inversion layers but accumulation layers. The accumulation layers can be formed to have a thicker (deeper) channel area in comparison with the conventional inversion layers under the same degree of gate voltage, so that the cross-sectional area of the channel area can be enlarged. Furthermore, a carrier density on the surface of the channel region can be increased. As a result, the channel resistance can be reduced in comparison with the conventional case.

In addition, the thickness c of the gate insulating films 5a and 5b, at the bottom portions of the gate electrodes 6a and 6b, are formed to be thick, so that resistance of the n– type drift layer 2 can be reduced. Therefore, ON resistance of the device can be reduced lower than the conventional power MOSFET.

For example, it is possible to form a power MOSFET that has 36V of breakdown voltage and 4.8 m$\Omega$ ON resistance, which means that the ON resistance can be reduced to about one fourth the ON resistance in comparison with the conventional device having 20 m$\Omega$ ON resistance. In addition, the threshold value can be also set at low value, i.e., at 1 V.

(Second Embodiment)

Figure 4:
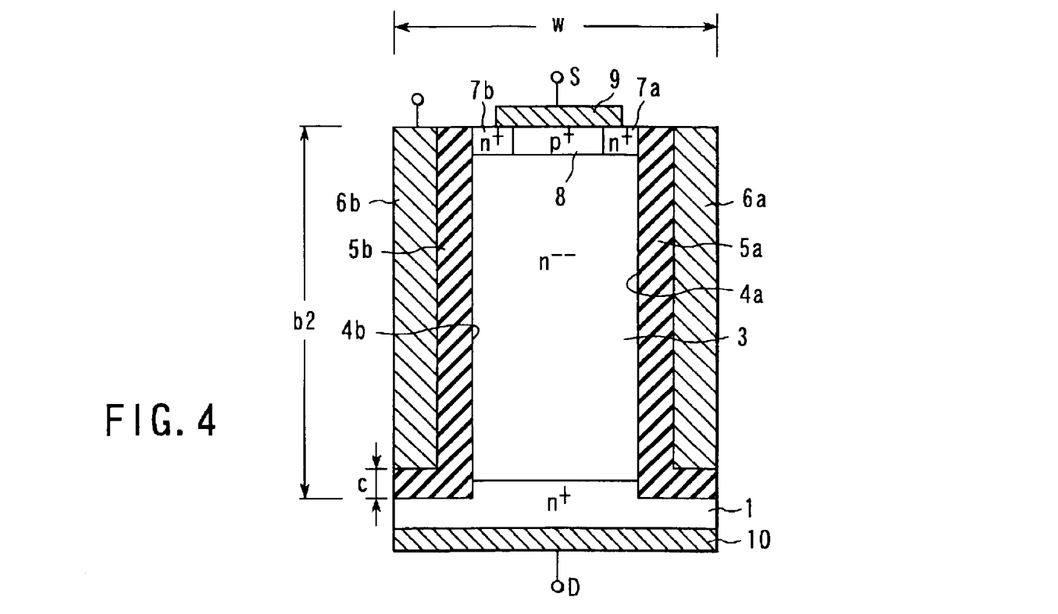
FIG. 4 is a diagrammatic cross-sectional view showing the structure of a unit cell part in a power MOSFET according to a second embodiment of the invention.

In the first embodiment shown in FIG. 1, the device is configured such that the drift layer 2 is inserted in between the silicon substrate 1 and the base layer 3 so as to heighten the breakdown voltage with a result that the breakdown voltage of the device is increased. According to another embodiment of the invention, it is possible to provide a device whose breakdown voltage can be relatively low. FIG. 4 is a cross-sectional view showing the structure of a unit cell part according to the second embodiment. In FIG. 4, the same constituting elements as those of FIG. 1 are indicated by the same reference numerals to avoid the repetition of explanations.

In FIG. 4, specific points different from ones in FIG. 1 are that the drift layer 2 shown in FIG. 1 is omitted in FIG. 4, and the bottoms of the trenches 4a and 4b are extended into the silicon substrate 1 and formed to have the depth b2.

As a result, an n– type of drift layer part does not exist between bottom faces of the gate electrodes 6a, 6b and the n+ type silicon substrate 1. Therefore, ON resistance of the device can be reduced lower than one in the first embodiment by the extent of the n–type of drift layer part.

(Third Embodiment)

Figure 5:
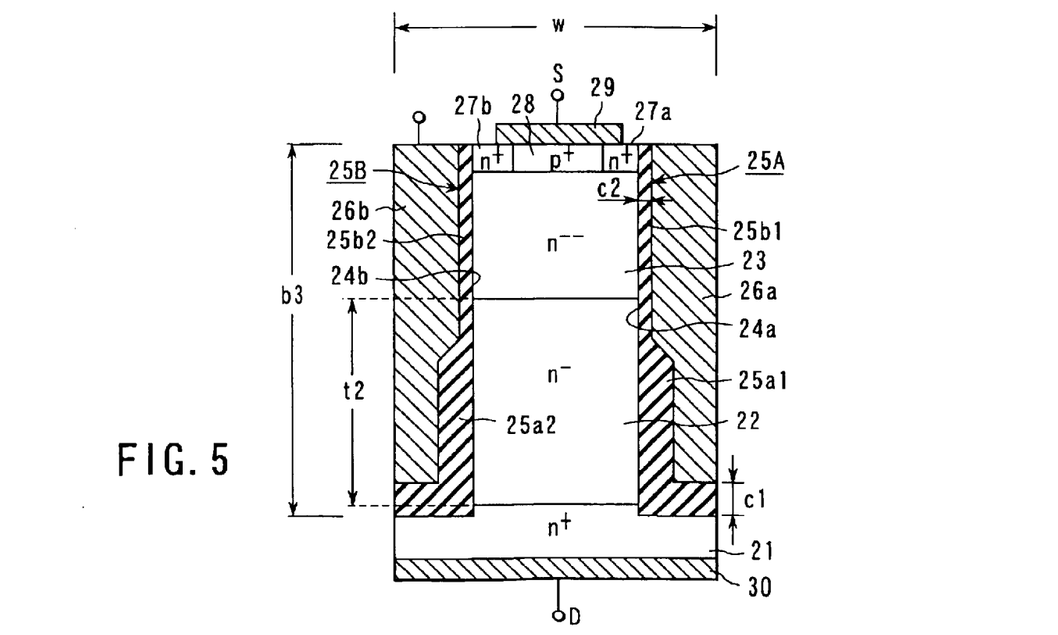
FIG. 5 is a diagrammatic cross-sectional view showing the structure of a unit cell part in a power MOSFET according to a third embodiment of the invention.

FIG. 5 is a diagrammatic cross-sectional view showing the structure of a unit cell part in an n-channel type of trench gate vertical-type power MOSFET according to a third embodiment of the invention.

In this embodiment, specific points different from ones in FIG. 1 are that trenches 24a, 24b are formed to pass through a drift layer 22 and extend to an n+ type silicon substrate 21, and gate insulating films 25A, 25B are formed such that the thickness of the gate insulating film portions 25b1, 25b2, which are corresponding portions of the gate insulating films 25A, 25B to an n—-type epitaxial layer 23, is formed to be thinner in comparison with the thickness of the other portions 25a1, 25a2.

That is, as shown in FIG. 5, in the power MOSFET, an n– type drift layer 22 is formed by the epitaxial growth on a first main surface of the n+ type silicon substrate 21 as a drift layer, and an n—-type epitaxial layer 23 as a base layer is formed by the epitaxial growth on the n– type drift layer 22.

In the n—-type base layer 23, the n– type drift layer 22 and the n+ silicon substrate 21, a plurality of (only one pair is shown in FIG. 5) trenches 24a and 24b are formed to have the depth b3 that extends into the n+ type silicon substrate 21.

In the respective trenches 24a and 24b, gate electrodes (control electrodes) 26a and 26b are buried, respectively, with the gate insulating films 25A and 25B interposed therebetween. As described above, the gate insulating films 25A and 25B comprise thick gate insulating film portions 25a1 and 25a2, and thin gate insulating film portions 25b1 and 25b2, respectively.

In a surface region of the n—-type base layer 23, n+ type source layers 27a and 27b are formed by an impurity selective diffusion method adjacent to the thin gate insulating film portions 25b1 and 25b2 formed in the trenches 24a and 24b, respectively. In addition, in the surface region of the n—-type base layer 23 between the n+ type source layers 27a and 27b, a p+ type base layer 28 is formed by an impurity selective diffusion method. A source electrode 29 as the first main electrode is provided so as to come into contact with both the n+ type of source layers 27a, 27b and the p+ type of base layer 28.

In addition, on the second main surface of the n+ type silicon substrate 21, opposite side to the n– type drift layer 22, a drain electrode 30 as the second main electrode is provided.

In the third embodiment, in the same manner as the first embodiment, the conventional p type base layer is replaced with the n—-type base layer 23 that has high resistance. The n—-type base layer 23 is so formed to have the width w in a longitudinal direction and the impurity concentration N that, when 0 volt is applied between the gate electrodes 26a, 26b and the source electrode 29, the n--type base layer 23 is clamped at 0V and held to be completely depleted.

Additionally, the gate insulating film portions 25$b$1 and 25$b$2 corresponding to sides of the n--type base layer 23 are formed to be thin films, for example, films having the thickness of 25 nm. Accordingly, when 0 volt is applied between the gate electrodes 26$a$, 26$b$ and the source electrode 29, the n--type base layer 23 is clamped at 0V completely. In addition, with low positive voltage, accumulating layers as channels are formed on both sides of the n--type base layer 23. The gate insulating film portions 25$a$1 and 25$a$2 corresponding to sides of the n– type drift layer 22 and the top of the n+ type silicon substrate 21 are formed to be thick films, for example, films having the thickness of 150 nm. Then, the gate insulating film portions 25$a$1 and 25$a$2 are made to share voltage to be applied to the n– type drift layer 22 so as to improve breakdown voltage of the n– type drift layer 22.

Furthermore, in the embodiment shown in FIG. 5, the trenches 24$a$ and 24$b$ are formed to extend to the n+ type silicon substrate 21, so that a resistance element bore by the n– type drift layer 2, which exists between the bottom faces of the gate electrodes and the n+ type silicon substrate 1 in the first embodiment, is eliminated.

Figure 6:
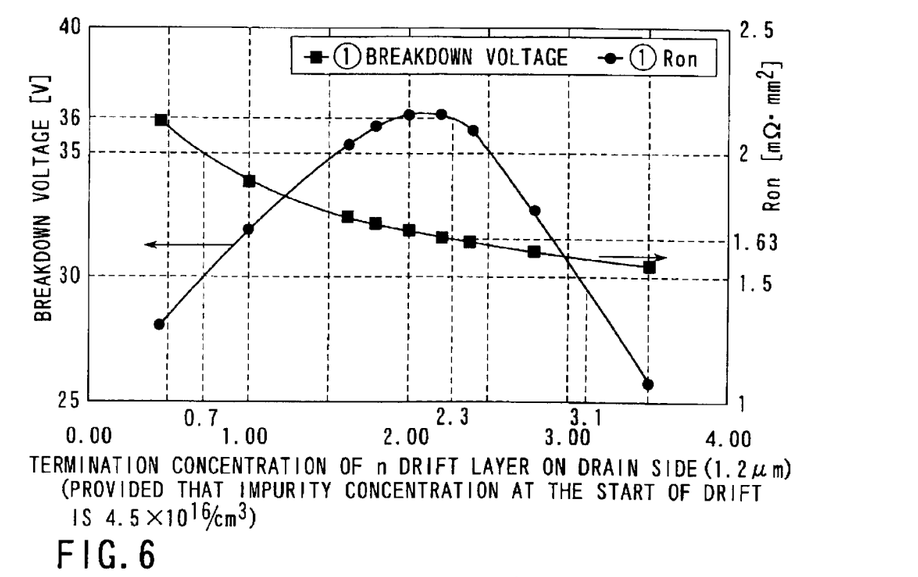
FIG. 6 is a graph showing the relationship between an impurity concentration on a drain side of an n– type drift layer according to the third embodiment of the invention and a breakdown voltage.

FIG. 6 shows curves of the relation among impurity concentration of the termination (the position of 1.2 $\mu$m into the drift layer 22 from the interface between the drift layer 22 and the drain layer 21) on the drain side of the n– type drift layer 22 shown in FIG. 5, breakdown voltage and ON resistance Ron [m$\Omega$.mm$^2$]. As it is clarified from the curves, the breakdown voltage and ON resistance are dependent on the impurity concentration of the termination on the drain side of the n– type drift layer 22.

That is, in a case where the trenches 24$a$ and 24$b$ are formed to extend to the n+ type silicon substrate 21, the impurity concentration of the termination on the n+ type silicon substrate (drain) 21 side of the n– type drift layer 22 is adjusted, so that desirable breakdown voltage and ON resistance can be attained.

For example, in order to attain the breakdown voltage of 36V, the impurity concentration at the termination on the drain side of the drift layer 22 may be set at 2.3×10$^{17}$/cm$^3$. In this case, the ON resistance can also be attained with the value of 1.63 m$\Omega$.mm$^2$, which is lower than the conventional one. Accordingly, in order to attain the ON resistance equal to or lower than the conventional ON resistance of 2.0 m$\Omega$.mm$^2$ with the desirable breakdown voltage of 30V, the impurity concentration may be set in the range of 0.7×10$^{17}$ to 3.1×10$^{17}$ cm$^3$, preferably, in the range of 1.0×10$^{17}$ to 3.1×10$^{17}$ cm$^3$.

An example of specific dimensions in the device according to the embodiment of FIG. 5 will be described below.

That is, the width w is set at 0.8 $\mu$m; the depth b3 of the trenches 24$a$, 24$b$, 2.0 $\mu$m; the thickness c2 of the thin gate insulating film portions 25$b$1 and 25$b$2, 25 nm; the thickness c1 of the thick gate insulating film portions 25$a$1 and 25$a$2, 150 nm; and the thickness t2 of the drift layer 22, 1.2 $\mu$m.

Next, a method of manufacturing the power MOSFET according to the embodiment shown in FIG. 5 will be explained with reference to cross-sectional views of the manufacturing process shown in FIGS. 7A to 7K.

Figure 7A:
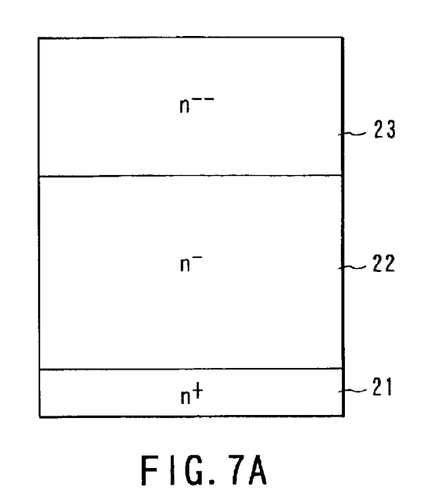
FIGS. 7A to 7K are cross-sectional views showing the structures at steps of a manufacturing process of the unit cell part in the power MOSFET according to the third embodiment of the invention.

First of all, as shown in FIG. 7A, the n– type drift layer 22 and n--type base layer 23 are formed sequentially on the n+ type silicon substrate 21 by epitaxial growth.

Figure 7B:
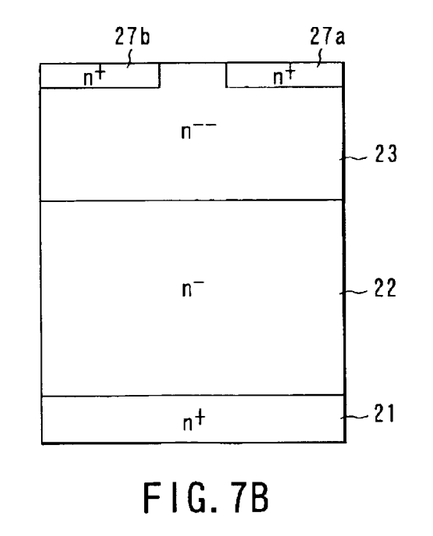

Then, as shown in FIG. 7B, the n+ type source layers 27$a$ and 27$b$ are formed selectively in a surface region of the n--type base layer 23 with use of a diffusion mask.

Figure 7C:
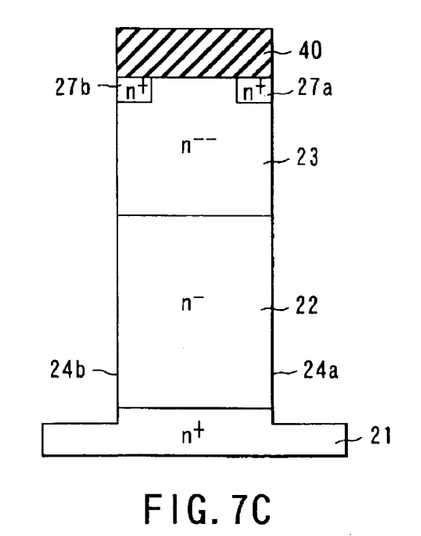

As shown in FIG. 7C, an etching mask 40 is provided in a predetermined area on the n--type base layer 23 including the n+ type source layers 27$a$ and 27$b$. Using the etching mask 40, anisotropic etching is performed by, for example, reactive ion etching (will be referred to as "RIE", hereinafter) method or the like, so that the trenches 24$a$ and 24$b$ are formed to have the depth that they extend to the halfway depth of the n+ type silicon substrate 21 from the surface of the n--type base layer 23.

Figure 7D:
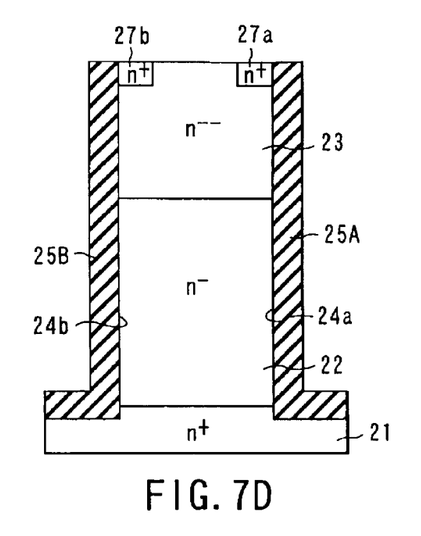

Next, as shown in FIG. 7D, the thick gate insulating films 25A and 25B are formed by the well-known thermal oxidation method or the like to have the thickness of 150 nm on the sides and bottom faces of the trenches 24$a$ and 24$b$, respectively.

Figure 7E:
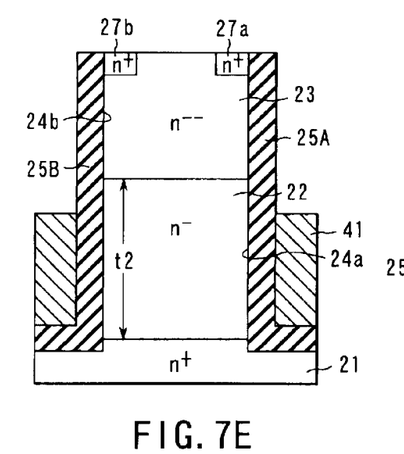

Then, as shown in FIG. 7E, an electrode material 41 such as polysilicon, is formed in each of the trenches 24$a$ and 24$b$ by chemical vapor deposition (will be referred to as "CVD", hereinafter) or the like to have the thickness equal to or less than the thickness t2 of the n– type drift layer 22.

Figure 7F:
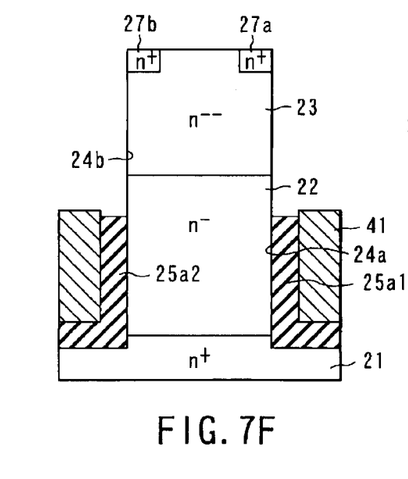

Following the above, as shown in FIG. 7F, the part of the respective gate insulating films 25A and 25B, which is not covered with the electrode material 41, i.e., the part of the respective gate insulating films 25A and 25B on side walls of the n--type base layer 23 and the n– type drift layer 22 adjacent to the base layer 23, is eliminated by etching, thereby keeping the thick gate insulating films 25$a$1 and 25$a$2.

Figure 7G:
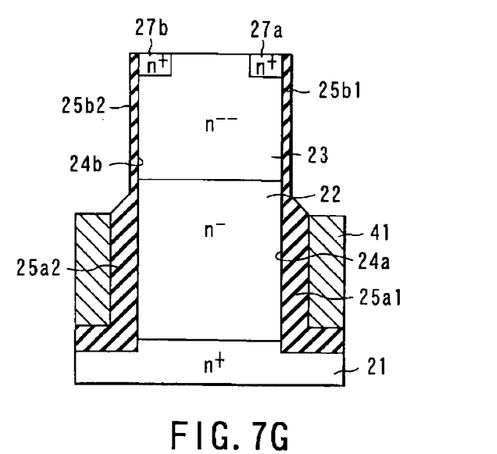

Next, as shown in FIG. 7G, the thin gate insulating films 25$b$1 and 25$b$2 are formed on the whole side walls of the n--type base layer 23 and upper portions of the n– type drift layer 22, by the well-known thermal oxidation method or the like, with the thickness of 25 nm.

Figure 7H:
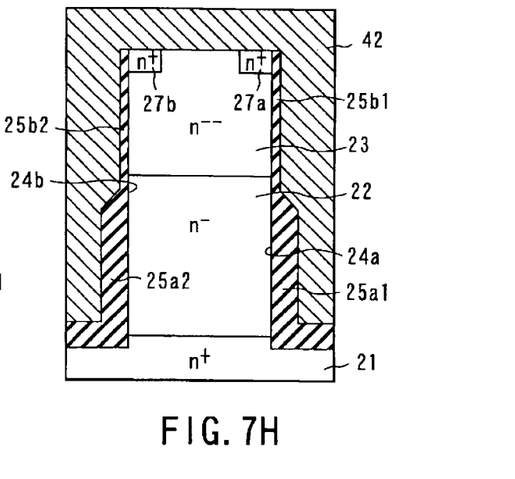

After eliminating the electrode material film 41, as shown in FIG. 7H, a gate electrode material film 42 such as polysilicon is deposited by the CVD method in a manner of filling the trenches 24$a$ and 24$b$.

Figure 7I:
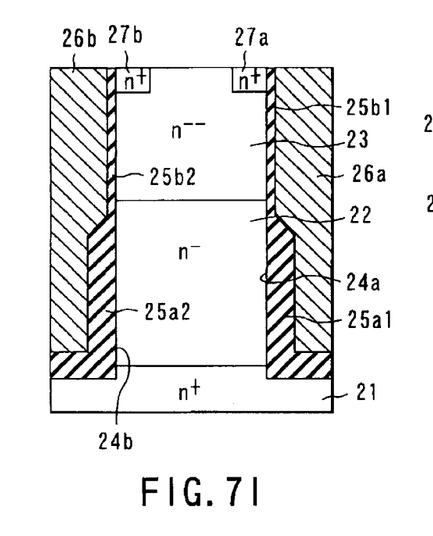

After that, as shown in FIG. 7I, the gate electrode material film 42 on the top of the n--type base layer 23 is removed by the CMP method etc. However, the film 42 is kept only in the trenches 24$a$ and 24$b$ by the well-known etchback method etc. As a result, gate electrodes 26$a$ and 26$b$ are buried in the trenches 24$a$, 24$b$.

Figure 7J:
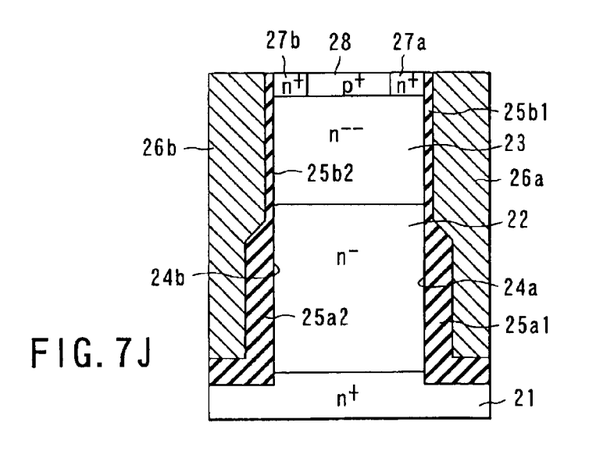
Figure 7K:
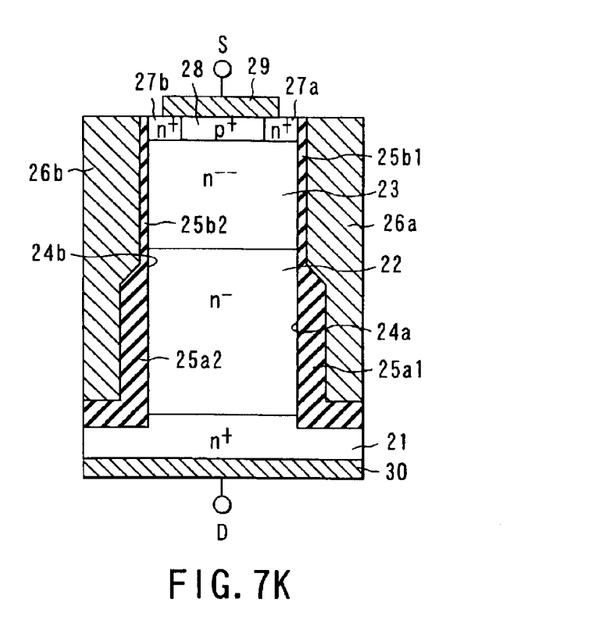

Next, as shown in FIG. 7J, a p+ type base layer 28 is formed by an impurity selective diffusion method in the surface region of the n--type base layer 23 between the n+ type source layers 27$a$ and 27$b$ with use of the diffusion mask. After that, as shown in FIG. 7K, a source electrode 29 is formed so as to come into contact with both the n+ type source layers 27$a$, 27$b$ and the p+ type of base layer 28. In addition, a drain electrode 30 is formed on the underside of the n+ type silicon substrate 21, opposite side to the n– type drift layer 22. Then, the power MOSFET is completed.

According to the power MOSFET having the structure described above, in the same manner as the first embodiment, the channel resistance can be definitely reduced. Furthermore, the impurity concentration of the n– type drift layer 22 is increased by one digit up, so that the resistance of the n– type drift layer 22 can be reduced. In addition, since the n– type drift layer 22 does not exist between the bottoms of the gate electrodes 26$a$ and 26$b$ and the n+ type silicon substrate 21, the resistance of the n– type drift layer 22 can be further reduced. As a result, the ON resistance of the device can be greatly reduced. For example, assuming that the impurity concentration of the termination on the drain side of the n– type drift layer 22 is set at 2.3×10$^{17}$ cm$^3$, by referring to FIG. 6, it is possible to attain the ON resistance of 1.63 m$\Omega$.mm$^2$, which is lower than the conventional one, with the breakdown voltage of 36V.

Figure 8:
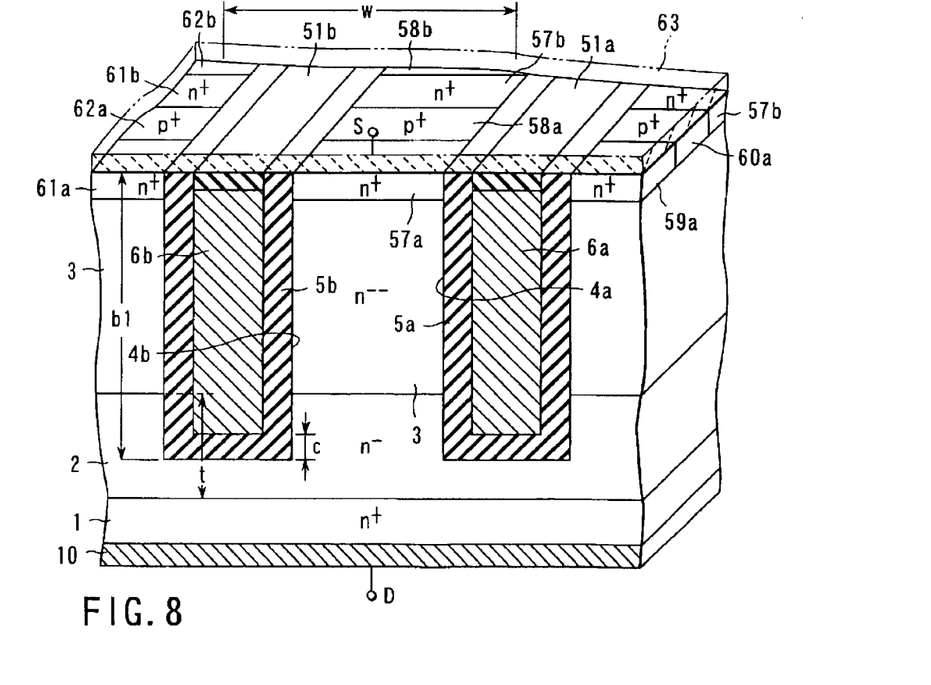
FIG. 8 is a diagrammatic cross-sectional view showing the structure of a unit cell part in a power MOSFET according to a fourth embodiment of the invention.

In the embodiment shown in FIG. 1, the device has a structure in that the n+ source layers 7a and 7b are formed in the surface region of the n-type base layer 3 along the top ends of the pair of gate insulating films 5a and 5b, which are opposed to each other, and the p+ type base layer 8 is formed between the n+ source layers 7a and 7b. However, the layout of the source layers 7a, 7b and the base layer 8 is not limited to one above described. For example, it is possible to dispose the relevant layers as shown in FIG. 8. FIG. 8 is a perspective view showing the structure of a unit cell according to still another embodiment of the invention. In the embodiment shown in FIG. 8, the same constituting elements as those of FIG. 1 are indicated by the same reference numerals so as to avoid the repetition of explanations.

In FIG. 8, the gate insulating films 5a and 5b, each having a U-shape, are formed in two of trenches 4a and 4b which are adjacent to each other, respectively. The gate electrodes 6a and 6b are buried or formed by filling the films 5a and 5b with polysilicon. The tops of the gate electrodes 6a and 6b are covered with silicon oxide films 51a and 51b, respectively.

In the surface region of the n--epitaxial base layer 3, a plurality of n+ type source layers 57a, 57b, . . . and a plurality of p+ type base layers 58a, 58b, . . . are arranged alternately in the state where each of the source layers and base layers are put between the gate insulating films 5a and 5b in the longitudinal direction of the gate electrodes 6a, 6b. That is, in the case shown in FIG. 1, only one source layer, which is the n+ type source layer 7a, is arranged along one of the gate insulating films that is the gate insulating film 5a, and another source layer, the n+ type source layer 7b, is arranged along the other gate insulating film 5b. On the other hand, in the example shown in FIG. 8, one end of the plurality of source layers 57a, 57b, . . . is arranged along one of the gate insulating films, which is the gate insulating film 5a, and the other end of the source layers is arranged along the other gate insulating film 5b.

In the same manner as the above, on the upper side of the gate insulating film 5a, which is opposite to the side opposing against the gate insulating film 5b, source layers 59a, 59b, . . . and base layers 60a, 60b, . . . are arranged alternately between a gate insulating film formed in adjacent another trench (not shown) and the gate insulating film 5a. In the same manner, on the side of the gate insulating film 5b as well, source layers 61a, 61b, . . . and base layers 62a, 62b, . . . are arranged alternately between another gate insulating film formed in adjacent still another trench (not shown) and the gate insulating film 5b.

All the source layers 57a, 57b, 59a, 59b, 61a, 61b, . . . and base layers 58a, 60a, 62a, 62b, . . . are connected in common to a single source electrode shown by a broken line, which is formed on these source layers.

Note that, the invention is not limited to the respective embodiments described above, but can also be modified variously without departing from the spirit and scope of the invention.

For example, in the first embodiment, the thickness of the gate insulating films 5a and 5b may differ at the boundary between the n-type base layer 3 and the n− type drift layer 2 in the same manner as the third embodiment.

In addition, in the first embodiment, the impurity concentration of the n− type drift layer 2 is set higher on the drain side than one on the source side.

In addition, in the first embodiment, the trenches can be formed to extend to the semiconductor substrate from the surface of the epitaxial layer.

Additionally, in the third embodiment, the thickness t2 of the n− type drift layer 22 may be set to satisfy the relational expression in the first embodiment.

As described above, according to the invention, the ON resistance of the device can be reduced while miniaturizing the power MOSFET device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A power MOSFET, comprising:
   a low resistive semiconductor substrate of a first conductivity type having a first main surface and a second main surface opposing to each other;
   a drift layer of the first conductivity type formed on the first main surface of the semiconductor substrate;
   a high resistive epitaxial layer of the first conductivity type formed on the drift layer;
   trenches formed in the epitaxial layer and the drift layer to extend from a surface of the epitaxial layer into the drift layer, the trenches having bottom portions surrounded by the drift layer;
   gate electrodes buried in the trenches with gate insulating films interposed between walls of the trenches and the gate electrodes;
   first and second low resistive source layers of the first conductivity type formed in a surface region of the epitaxial layer adjacent to the gate insulating films;
   a low resistive base layer of a second conductivity type formed in the surface region of the epitaxial layer between the first and second source layers;
   a source electrode electrically and commonly connected to the source layers and the base layer; and
   a drain electrode electrically connected to the second main surface of the semiconductor substrate, wherein
   the drift layer has an impurity concentration higher than that of the epitaxial layer and the epitaxial layer intervening between the trenches is depleted in a case where no voltage is applied between the source electrode and the gate electrodes.

2. The power MOSFET according to claim 1, wherein the semiconductor substrate is a silicon substrate, and the drift layer is formed to satisfy a relational expression: $t<VB/3\times10^5$ V/cm,
   where the thickness of the drift layer is t, a breakdown voltage of the power MOSFET is VB, and breakdown critical electric field of silicon is $3\times10^5$ V/cm.

3. The power MOSFET according to claim 1, wherein a width of the epitaxial layer intervening between the trenches is set at 0.8 $\mu$m or less.

4. The power MOSFET according to claim 2, wherein a width of the epitaxial layer intervening between the trenches is set at 0.8 $\mu$m or less.

5. The power MOSFET according to claim 1, wherein an impurity concentration of the epitaxial layer intervening between the trenches is set at $1\times10^{15}/cm^3$ or less.

6. The power MOSFET according to claim 2, wherein an impurity concentration of the epitaxial layer intervening between the trenches is set at $1\times10^{15}/cm^3$ or less.

7. The power MOSFET according to claim 3, wherein an impurity concentration of the epitaxial layer intervening between the trenches is set at $1\times10^{15}/cm^3$ or less.

8. The power MOSFET according to claim 4, wherein an impurity concentration of the epitaxial layer intervening between the trenches is set at $1\times10^{15}/cm^3$ or less.

9. The power MOSFET according to claim 1, wherein the trenches are formed to extend from the surface of the epitaxial layer to the semiconductor substrate.

10. A power MOSFET, comprising:

a low resistive semiconductor substrate of a first conductivity type having a first main surface and a second main surface opposing to each other;

a high resistive epitaxial layer of the first conductivity type formed on the first main surface of the semiconductor substrate;

trenches formed to extend from a surface of the epitaxial layer to the semiconductor substrate, the trenches having bottom portions surrounded by the semiconductor substrate;

gate electrodes buried in the trenches with gate insulating films interposed between the gate electrodes and walls of the trenches;

first and second low resistive source layers of the first conductivity type formed in a surface region of the epitaxial layer adjacent to the gate insulating films;

a low resistive base layer of a second conductivity type formed in the surface region of the epitaxial layer between the first and second low resistive source layers;

a source electrode electrically and commonly connected to the source layer and the base layer; and a drain layer electrically connected to the second main surface of the semiconductor substrate, wherein the semiconductor substrate has an impurity concentration higher than that of the high resistive epitaxial layer and the epitaxial layer intervening between the trenches is in a state of being depleted in a case where 0 volt is applied between the source electrode and the gate electrodes.

11. The power MOSFET according to claim 10, wherein a width of the epitaxial layer intervening between the trenches is set at 0.8 μm or less.

12. The power MOSFET according to claim 10, wherein an impurity concentration of the epitaxial layer intervening between the trenches is set at $1 \times 10^{15}/cm^3$ or less.

13. The power MOSFET according to claim 11, wherein an impurity concentration of the epitaxial layer intervening between the trenches is set at $1 \times 10^{15}/cm^3$ or less.

14. A power MOSFET, comprising:

a low resistive semiconductor substrate of a first conductivity type having a first main surface and a second main surface opposing to each other;

a drift layer of the first conductivity type formed on the first main surface of the semiconductor substrate;

a high resistive epitaxial layer of the first conductivity type formed on the drift layer;

trenches formed to extend from a surface of the epitaxial layer into the semiconductor substrate, the trenches having bottom portions surrounded by the semiconductor substrate;

gate electrodes buried in the trenches with gate insulating films interposed between the gate electrodes and walls of the trenches;

first and second low resistive source layers of the first conductivity type formed in a surface region of the epitaxial layer adjacent to the gate insulating films;

a low resistive base layer of a second conductivity type formed in the surface region of the epitaxial layer between the first and second low resistive source layers;

a source electrode electrically and commonly connected to the source layers and the base layer; and a drain electrode electrically connected to the second main surface of the semiconductor substrate, wherein the semiconductor substrate has an impurity concentration higher than that of the high resistive epitaxial layer and the epitaxial layer intervening between the trenches is depleted in a case where 0 volt is applied between the source electrode and the gate electrodes, and the thickness of a part in the gate insulating films corresponding to the epitaxial layer is thinner than the other parts thereof.

15. The power MOSFET according to claim 14, wherein an impurity concentration of the drift layer on a side of the drain electrode is higher than that of a side of the source electrode.

16. The power MOSFET according to claim 14, wherein an impurity concentration of the drift layer is $1 \times 10^{16}/cm^3$ to $7 \times 10^{16}/cm^3$ on the side of the source electrode, and $1 \times 10^{17}/cm^3$ to $3 \times 10^{17}/cm^3$ on the side of the drain electrode.

17. The power MOSFET according to claim 14, wherein the semiconductor substrate is a silicon substrate, and the drift layer is formed to satisfy a relational expression:

$t < VB/3 \times 10^5$ V/cm, where the thickness of the drift layer is t, a breakdown voltage of the power MOSFET is VB, and a breakdown critical electric field of silicon is $3 \times 10^5$ V/cm.

18. The power MOSFET according to claim 15, wherein the semiconductor substrate is a silicon substrate, and the drift layer is formed to satisfy a relational expression:

$t < VB/3 \times 10^5$ V/cm, where the thickness of the drift layer is t, a breakdown voltage of the power MOSFET is VB, and a breakdown critical electric field of silicon is $3 \times 10^5$ V/cm.

19. The power MOSFET according to claim 16, wherein the semiconductor substrate is a silicon substrate, and the drift layer is formed to satisfy a relational expression:

$t < VB/3 \times 10^5$ V/cm, where the thickness of the drift layer is t, a breakdown voltage of the power MOSFET is VB, and a breakdown critical electric field of silicon is $3 \times 10^5$ V/cm.

20. The power MOSFET according to claim 14, wherein a width of the epitaxial layer intervening between the trenches is set at 0.8 μm or less.

21. The power MOSFET according to claim 15, wherein a width of the epitaxial layer intervening between the trenches is set at 0.8 μm or less.

22. The power MOSFET according to claim 16, wherein a width of the epitaxial layer intervening between the trenches is set at 0.8 μm or less.

23. The power MOSFET according to claim 17, wherein a width of the epitaxial layer intervening between the trenches is set at 0.8 μm or less.

24. The power MOSFET according to claim 18, wherein a width of the epitaxial layer intervening between the trenches is set at 0.8 μm or less.

25. The power MOSFET according to claim 19, wherein a width of the epitaxial layer intervening between the trenches is set at 0.8 μm or less.

26. The power MOSFET according to claim 14, wherein an impurity concentration of the epitaxial layer intervening between the trenches is set at $1 \times 10^{15}/cm^3$ or less.

27. The power MOSFET according to claim 15, wherein an impurity concentration of the epitaxial layer intervening between the trenches is set at $1 \times 10^{15}/cm^3$ or less.

28. The power MOSFET according to claim 16, wherein an impurity concentration of the epitaxial layer intervening between the trenches is set at $1\times10^{15}/cm^3$ or less.

29. The power MOSFET according to claim 17, wherein an impurity concentration of the epitaxial layer intervening between the trenches is set at $1\times10^{15}/cm^3$ or less.

30. The power MOSFET according to claim 20, wherein an impurity concentration of the epitaxial layer intervening between the trenches is set at $1\times10^{15}/cm^3$ or less.

31. A power MOSFET, comprising:
 a low resistive semiconductor substrate of a first conductivity type having a first main surface and a second main surface opposing to each other;
 a drift layer of the first conductivity type formed on the first main surface of the semiconductor substrate;
 a high resistive epitaxial layer of the first conductivity type formed on the drift layer;
 trenches formed in the epitaxial layer and the drift layer to extend from a surface of the epitaxial layer into the drift layer, the trenches having bottom portions surrounded by the drift layer;
 gate electrodes buried in the trenches with gate insulating films interposed between walls of the trenches and the gate electrodes;
 a plurality of low resistive source layers of the first conductivity type formed in a surface region of the epitaxial layer between the gate insulating films;
 a plurality of low resistive base layers of a second conductivity type interleaved among the plurality of low resistive source layers in the surface region of the epitaxial layer between the gate insulating films;
 a source electrode electrically and commonly connected to the plurality of source layers and the base layers; and
 a drain electrode electrically connected to the second main surface of the semiconductor substrate, wherein
 the drift layer has an impurity concentration higher than that of the epitaxial layer and the epitaxial layer intervening between the trenches is depleted in a case where no voltage is applied between the source electrode and the gate electrodes.

* * * * *